United States Patent
Teng et al.

(10) Patent No.: US 7,855,571 B2
(45) Date of Patent: Dec. 21, 2010

(54) TESTING CIRCUIT BOARD FOR PREVENTING TESTED CHIP POSITIONS FROM BEING WRONGLY POSITIONED

(75) Inventors: Cheng-Yung Teng, Taipei County (TW); Shao-Tien Kan, Taipei (TW); Yu-Sheng Chen, Taipei County (TW)

(73) Assignee: Princeton Technology Corporation, Taipei County (TW)

( * ) Notice: Subject to any disclaimer, the term of this patent is extended or adjusted under 35 U.S.C. 154(b) by 175 days.

(21) Appl. No.: 12/100,189

(22) Filed: Apr. 9, 2008

(65) Prior Publication Data

US 2009/0140746 A1    Jun. 4, 2009

(30) Foreign Application Priority Data

Dec. 4, 2007    (TW) ............................... 96220560 U

(51) Int. Cl.
*G01R 31/28* (2006.01)
(52) U.S. Cl. ..................................... 324/765; 324/755
(58) Field of Classification Search ....................... None
See application file for complete search history.

(56) References Cited

U.S. PATENT DOCUMENTS

| | | | |
|---|---|---|---|
| 4,859,189 A * | 8/1989 | Petersen et al. ............... | 439/66 |
| 6,179,640 B1 * | 1/2001 | Sikora et al. ................ | 439/342 |
| 6,413,110 B2 * | 7/2002 | Keller ........................ | 439/342 |
| 6,437,586 B1 * | 8/2002 | Robinson .................... | 324/755 |
| 6,798,228 B2 * | 9/2004 | Cuevas ....................... | 324/755 |

* cited by examiner

*Primary Examiner*—Vinh P Nguyen
(74) *Attorney, Agent, or Firm*—Muncy, Geissler, Olds & Lowe, PLLC

(57) ABSTRACT

A testing circuit board used in a testing system with a tester and a handler is disclosed. The testing circuit board is used for transmitting a plurality of testing signals provided by the tester to test at least two devices under test located on the handler. The testing circuit board includes a connecting board, a load board and at least two connecting interfaces. The connecting board coupled to the handler has at least two connecting sockets for respectively connecting to the devices under testing. The load board coupled to the tester has two joining sockets located corresponding to the connecting sockets. The at least two connecting interfaces are coupled between the connecting sockets and the joining sockets for transmitting the testing signals for testing the devices under testing.

10 Claims, 3 Drawing Sheets

TESTING CIRCUIT BOARD FOR PREVENTING TESTED CHIP POSITIONS FROM BEING WRONGLY POSITIONED

BACKGROUND OF THE INVENTION

1. Field of the Invention

The invention relates to a testing circuit board, and more particularly, to a testing circuit board which prevents tested chip positions from being wrongly positioned.

2. Description of the Related Art

To ensure integrated circuit (IC) quality before distribution, manufacturers test each of the ICs after completion of the manufacturing process. The tested results are utilized by manufacturers to determine IC qualification and suitable for delivery to vendors.

FIG. 1 shows a conventional IC production testing framework. As shown in FIG. 1, in this testing framework, a tester 10, serves as a tool for testing devices under test (DUT) 221-224. Each of the devices under test 221-224 may be an IC under test and is located on a handler 20 for testing convenience.

Please refer to FIGS. 1 and 2. FIG. 2 shows a conventional IC production testing circuit board. As shown in FIG. 1, in this testing framework, a tester 10 serves as a tool for testing devices under test (DUT) 221-224. Each of the devices under test 221-224 may be an IC under test and is located on a handler 20 for testing convenience. As shown in FIGS. 1 and 2, a connecting board 32 which has connecting sockets 321-324, each having terminals P1-P17 and $P_{NC}$, is located on the handler 20 and a load board 34 of the tester 10 has joining sockets 341-344, each having holes S1-S17 and $S_{NC}$. During testing, the devices under test 221-224 are located on the connecting board 32 on the handler 20, and each pin of the devices under test 221-224 is first coupled to a corresponding one of the terminals P1-P17 and $P_{NC}$ of the connecting sockets 321-324 and then coupled to a corresponding one of the holes S1-S17 and $S_{NC}$ of the joining sockets 341-344 through the connecting sockets 321-324 of the connecting board 32. Each of the connecting sockets 321-324 coupled by one of the DUTs 221-224 is coupled to a corresponding one of the joining sockets 341-344 by one of the cables 361-364 for transmitting testing signals provided by the tester 10 and output signals provided by the DUTs 221-224 so as to determine whether the DUTs 221-224 pass the test or not.

For example, assume that four DUTs are to be tested, thus four cables 361-364 are required to respectively couple to the connecting sockets 321-324 and join sockets 341-344 when the four DUTs 221-224 are being tested. If each of the DUTs 221-224 has eighteen pins, each of the cables 361-364 is required to have eighteen sub cables such that each sub cable is capable of coupling to a corresponding one of the terminals P1-P17 and PNC of the connecting sockets 321-324 and a corresponding one of the holes S1-S17 and SNC of the joining sockets 341-344. Therefore, a total of 72 sub cables are required for successfully performing the test. For each of the connecting sockets 321-324, and the positions of each of the terminals P1-P17 and PNC are the same. Similarly, for each of the joining sockets 341-344, and the positions of each of the holes S1-S17 and SNC are the same. In this case, connection errors for the sub cables may occur. However, in the aforementioned case, it is also possible that the tester 10 determined that the DUTs 221-224 had passed the test, even though the connection error for the sub cables had occurred. Thus, negatively influencing accuracy of the test results such that tests for the DUTs 221-224 cannot be completely and correctly performed.

BRIEF SUMMARY OF THE INVENTION

The embodiments of the invention provide a testing circuit board which prevents tested chip positions from being wrongly positioned so as to improve the convenience and accuracy of chip testing, solving the aforementioned problems with conventional testing circuit boards.

In one embodiment, a testing circuit board used in a testing system with a tester (not shown) and a handler (not shown) is disclosed. The testing circuit board is utilized for transmitting a plurality of testing signals provided by the tester to test at least two devices under test located on the handler. The testing circuit board comprises a connecting board, a load board and at least two connecting interfaces. The connecting board is coupled to the handler and has at least two connecting sockets respectively coupled to the devices under test in which each of the connecting sockets has a plurality of connecting terminals and a determining terminal. The load board is coupled to the tester and has at least two joining sockets in which each of the joining sockets has a plurality of joining holes and determining holes, wherein the joining sockets are respectively located corresponding to the connecting sockets and the determining holes are respectively located corresponding to the determining terminals. The connecting interfaces are coupled between the connecting sockets and the joining sockets for transmitting the testing signals for testing the devices under test. The positions of the determining holes are respectively located corresponding to that of the corresponding determining terminals.

BRIEF DESCRIPTION OF THE DRAWINGS

The invention can be more fully understood by reading the subsequent detailed description and examples with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
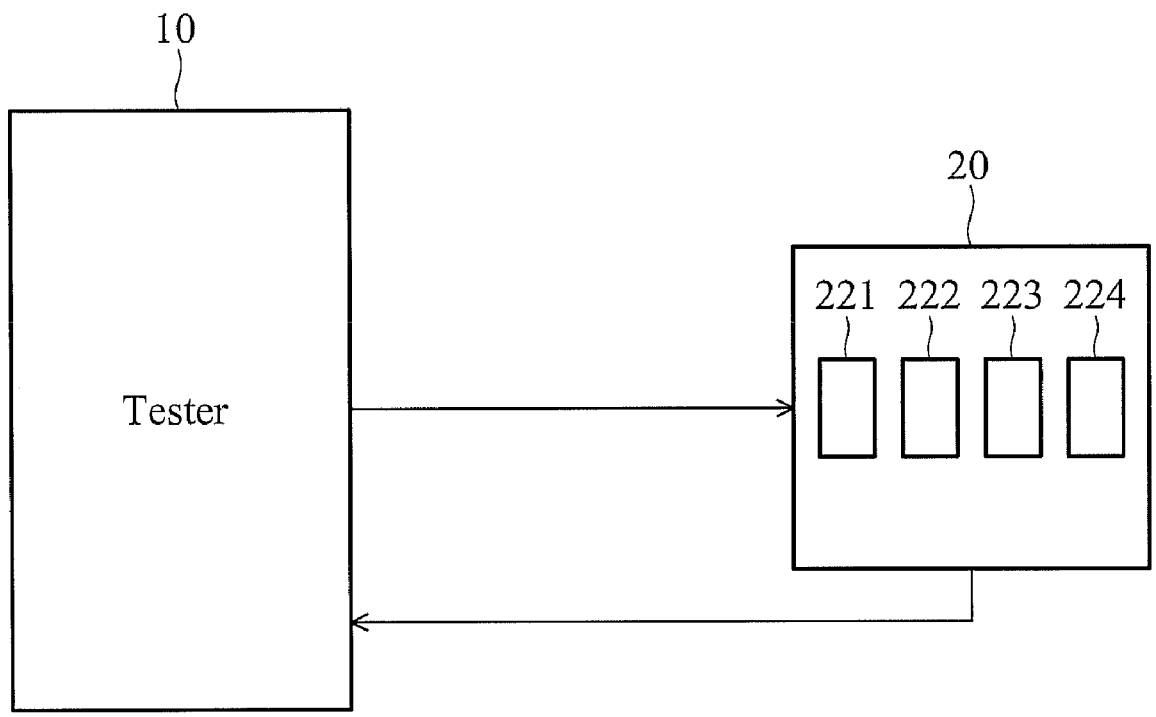
FIG. 1 shows a conventional IC production testing framework.
Figure 2:
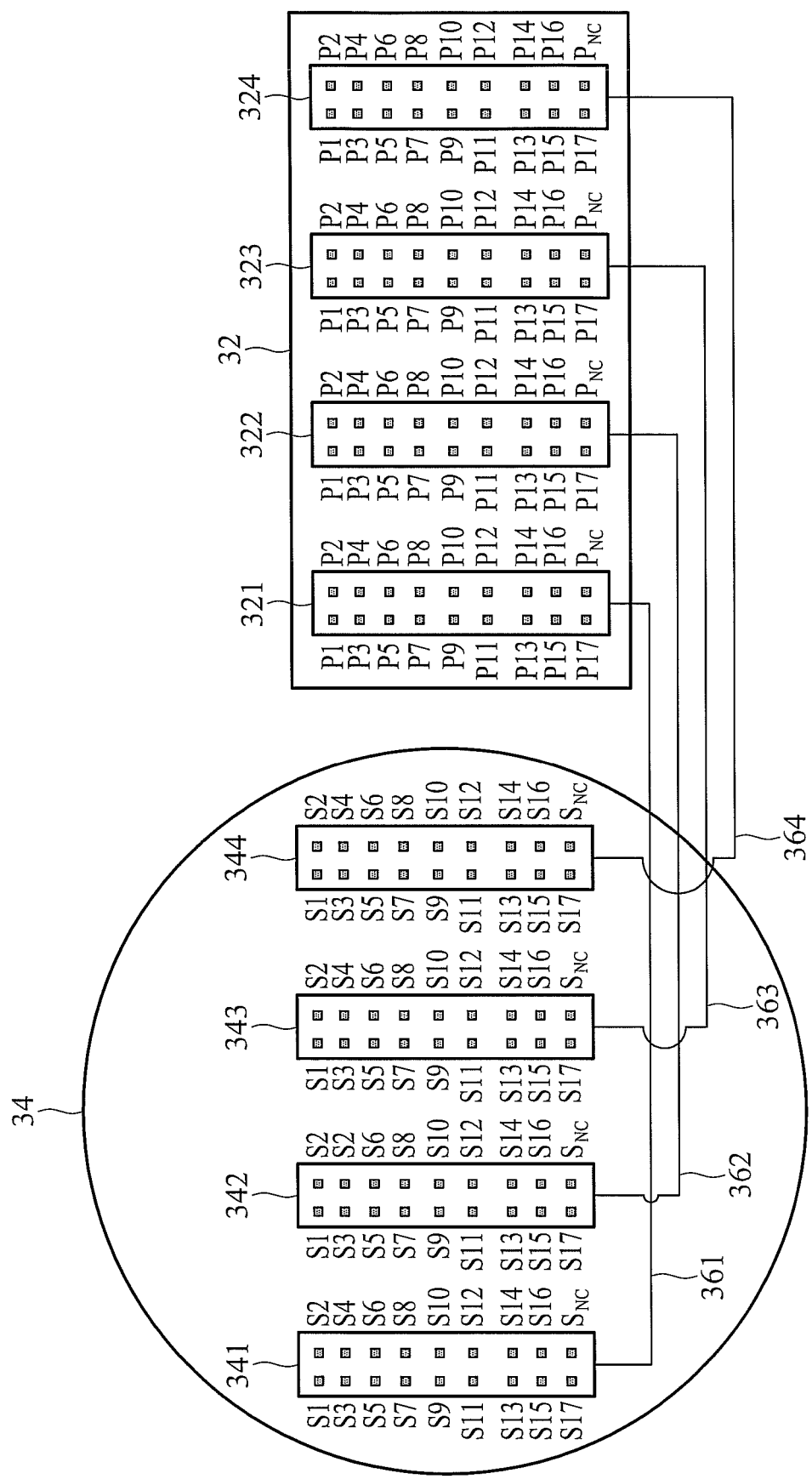
FIG. 2 shows a conventional IC production testing circuit board.
Figure 3:
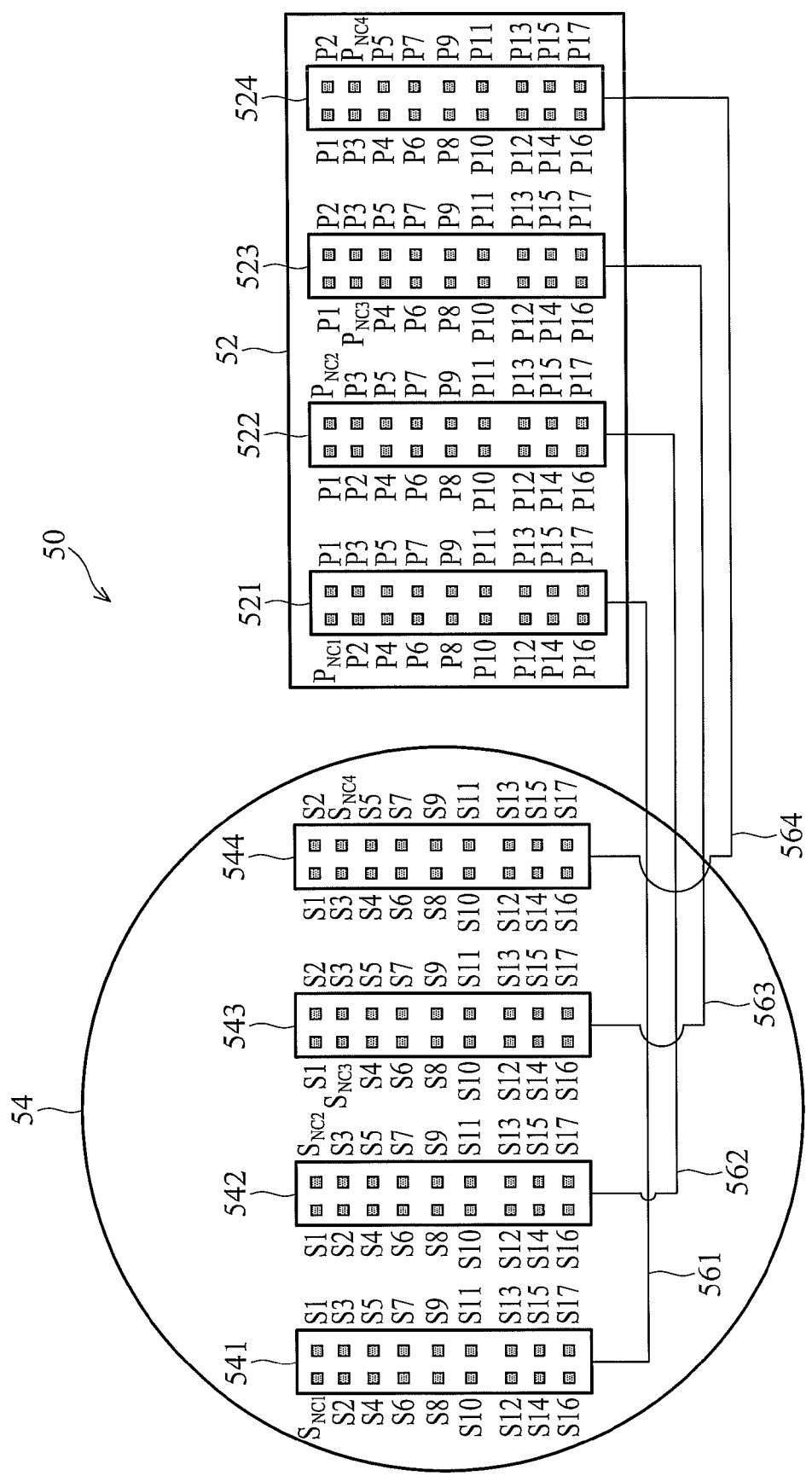
FIG. 3 shows an embodiment of a testing circuit board according to the invention.

FIG. 3 shows an embodiment of a testing circuit board according to the invention. As shown in FIG. 3, a testing circuit board 50 of the invention used in a testing system with a tester (not shown) and a handler (not shown) is illustrated. The testing circuit board 50 is utilized for transmitting a plurality of testing signals provided by the tester to test at least two devices under test (not shown) located on the handler and determining test results of the devices under test by the tester according to output signals, generated by the testing signals applied to the devices under test, which is fed back to the tester.

The testing circuit board 50 comprises a connecting board 52, a load board 54 and at least two connecting interfaces 561-564. The connecting board 52 is coupled to the handler and has at least two connecting sockets 521-524 respectively coupled to the devices under test in which each of the connecting sockets 521-524 has a plurality of connecting terminals P1-P17 and one of the determining terminals $P_{NC1}$-$P_{NC4}$.

The load board 54 is coupled to the tester and has at least two joining sockets 541-544 in which each of the joining sockets 541-544 has a plurality of joining holes S1-S17 and one of determining holes $S_{NC1}$-$S_{NC4}$, wherein the joining sockets 541-544 are respectively located corresponding to the connecting sockets 541-544 and the determining holes $S_{NC1}$-$S_{NC4}$ are respectively located corresponding to the determining terminals $P_{NC1}$-$P_{NC4}$.

The connecting interfaces 561-564 are coupled between the connecting sockets 521-524 and the joining sockets 541-544 for transmitting the testing signals for testing the devices under test (not shown). Each of the devices under test, for example, may be an IC.

In one embodiment, the connecting sockets 521-524 comprise a first connecting socket 521 having a first determining terminal $P_{NC1}$ and a second connecting socket 522 having a second determining terminal $P_{NC2}$, wherein the first determining terminal $P_{NC1}$ is located in a first relative position relative to the first connecting socket 521 and the second determining terminal $P_{NC2}$ is located in a second relative position relative to the second connecting socket 522.

The position of the determining hole $S_{NC}$ is respectively located corresponding to that of a corresponding determining terminal $P_{NC}$. In one embodiment, the connecting sockets 521-524 comprise a first connecting socket 521 having a first determining terminal $P_{NC1}$ and a second connecting socket 522 having a second determining terminal $P_{NC2}$, wherein the first determining terminal $P_{NC1}$ is located in a first position relative to the first connecting socket 521 and the second determining terminal $P_{NC2}$ is located in a second position relative to the second connecting socket 522. The relative positions for the determining terminals $P_{NC1}$-$P_{NC4}$ of the connecting sockets 521-524 are different from each other. With different positions between the determining terminals $P_{NC1}$-$P_{NC4}$, problems in connecting the connecting sockets 521-524 to an error corresponding one of the joining sockets 541-544 can be avoided.

Moreover, the testing signals comprise at least two determining signals for determining whether the determining terminals $P_{NC1}$-$P_{NC4}$ are respectively coupled to the corresponding determining holes $S_{NC1}$-$S_{NC4}$ to further determine whether the devices under test (not shown) are correctly connected to the tester. When the tester determines that the determining terminals $P_{NC1}$-$P_{NC4}$ are not respectively coupled to the corresponding determining holes $S_{NC1}$-$S_{NC4}$, a warning message is further provided for indicating that the devices under test are connected wrongly.

Each of the connecting interfaces 561-564 has a plurality of sub cables (not shown) in which the sub cables are utilized for respectively coupling the connecting terminals P1-P17 and the determining terminal $P_{NC1}$-$P_{NC4}$ to the corresponding joining holes S1-S17 and the corresponding determining holes $S_{NC1}$-$S_{NC4}$ for transmitting the testing signals. Each of the connecting interfaces 561-564 may be, for example, a bus. The number of the connecting terminals P1-P17 is larger than that of a plurality of pins on one of the devices under test. In one embodiment, the load board 54 and the connecting board 52 may be printed circuit boards.

In the embodiments of the invention, the testing circuit board of the invention is utilized to rearrange the positions of the determining terminals and the determining holes that was original located on the same position of each connecting socket and joining socket such that the determining terminals and the determining holes, which are included in every connecting sockets and joining sockets, are respectively located on different positions so as to prevent devices under test from being wrongly connected and to further prevent erroneous determination of passing the test for devices under test when there is a wrong connection. Compared with conventional testing circuit board techniques, the testing circuit board of the invention is capable of effectively improving the accuracy of IC testing.

While the invention has been described by way of example and in terms of preferred embodiment, it is to be understood that the invention is not limited thereto. To the contrary, it is intended to cover various modifications and similar arrangements (as would be apparent to the skilled in the art). Therefore, the scope of the appended claims should be accorded to the broadest interpretation so as to encompass all such modifications and similar arrangements.

What is claimed is:

1. A testing circuit board used in a testing system with a tester and a handler for transmitting a plurality of testing signals provided by the tester to test at least two devices under test located on the handler, comprising:
    a connecting board coupled to the handler, having at least two connecting sockets respectively coupled to the devices under test, wherein each of the connecting sockets has a plurality of connecting terminals and a determining terminal;
    a load board coupled to the tester, having at least two joining sockets each having a plurality of joining holes and a determining hole, wherein the joining sockets are respectively located corresponding to the connecting sockets and the determining holes are respectively located corresponding to the determining terminals; and
    at least two connecting interfaces coupled between the connecting sockets and the joining sockets for transmitting the testing signals for testing the devices under test,
    wherein the connecting sockets comprise a first connecting socket having a first determining terminal and a second connecting socket having a second determining terminal, wherein the first determining terminal is located in a first relative position relative to the first connecting socket and the second determining terminal is located in a second relative position other than the first relative position and relative to the second connecting socket.

2. The testing circuit board as claimed in claim 1, wherein the positions of the determining holes are respectively corresponding to that of the corresponding determining terminals.

3. The testing circuit board as claimed in claim 2, wherein the testing signals comprise at least two determining signals for the tester to determine whether the determining terminals are respectively coupled to the corresponding determining holes based on the determining signals to further determine whether the devices under test are correctly connected to the tester.

4. The testing circuit board as claimed in claim 3, wherein a warning message is further provided when the tester determines that the determining terminals are not respectively coupled to the corresponding determining holes.

5. The testing circuit board as claimed in claim 1, wherein each of the connecting interfaces has a plurality of sub cables, wherein the sub cables are utilized for respectively coupling the connecting terminals and the determining terminal to the corresponding joining holes and the corresponding determining holes for transmitting the testing signals.

6. The testing circuit board as claimed in claim 5, wherein the connecting interfaces are buses.

7. The testing circuit board as claimed in claim 1, wherein the number of the connecting holes is larger than that of a plurality of pins on one of the devices under test.

8. The testing circuit board as claimed in claim 1, wherein the devices under test are integrated circuits (ICs).

9. The testing circuit board as claimed in claim 1, wherein the load board is a printed circuit board.

10. The testing circuit board as claimed in claim 1, wherein the connecting board is a printed circuit board.

* * * * *